Figure 1:
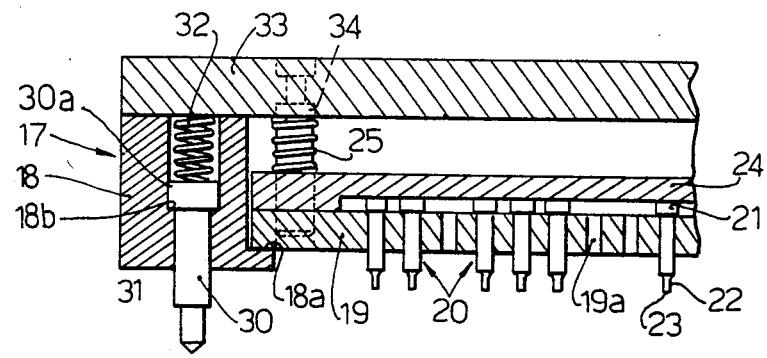
Figure 1:
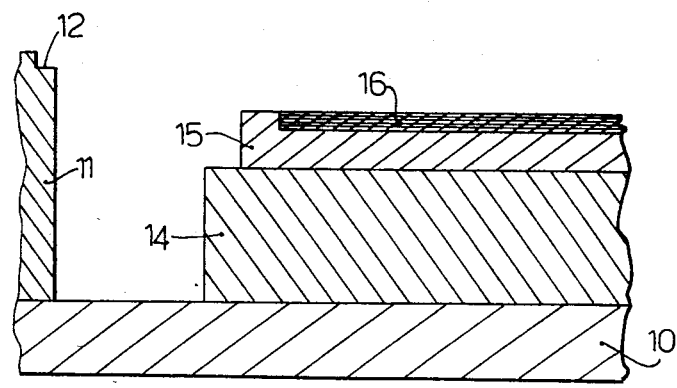

United States Patent [19]

Ferri et al.

[11] Patent Number: 4,569,305

[45] Date of Patent: Feb. 11, 1986

[54] APPARATUS TO PROVIDE THE APPLICATION OF GLUE ON PRESELECTED ZONES OF PRINTED CIRCUIT BOARDS

[75] Inventors: Beniamino Ferri, Monza; Giovanni Caimi, Saronno, both of Italy

[73] Assignee: Ferco s.r.l., Misinto, Italy

[21] Appl. No.: 543,902

[22] Filed: Oct. 20, 1983

Related U.S. Application Data

[63] Continuation of Ser. No. 310,064, Oct. 9, 1981, abandoned.

[51] Int. Cl.⁴ .................................................. B05C 1/00
[52] U.S. Cl. ................................... 118/211; 118/221; 118/225; 118/243; 118/255; 118/263; 427/96
[58] Field of Search ............... 118/243, 263, 211, 221, 118/225, 255; 427/96, 207.1

[56] References Cited

U.S. PATENT DOCUMENTS

| 3,576,669 | 4/1971 | Filip | 118/243 |
| 3,985,270 | 10/1976 | Larkin | 118/243 X |
| 4,096,825 | 6/1978 | Golias et al. | 118/221 X |
| 4,202,290 | 5/1980 | Hatfield | 118/221 |
| 4,292,116 | 9/1981 | Takahashi et al. | 156/566 |

FOREIGN PATENT DOCUMENTS

| 2915366 | 10/1979 | Fed. Rep. of Germany . |
| 2025804 | 1/1980 | United Kingdom . |

Primary Examiner—Bernard F. Plantz
Attorney, Agent, or Firm—Fleit, Jacobson, Cohn & Price

[57] ABSTRACT

Process and apparatus for providing the application of glue on preselected zones of a printed circuit, according to which provision is made for a tank containing liquid glue, and a series of push rods arranged at preselected positions, which first contact the glue in said tank, then deposit the drops of glue on a board for printed circuits.

5 Claims, 6 Drawing Figures

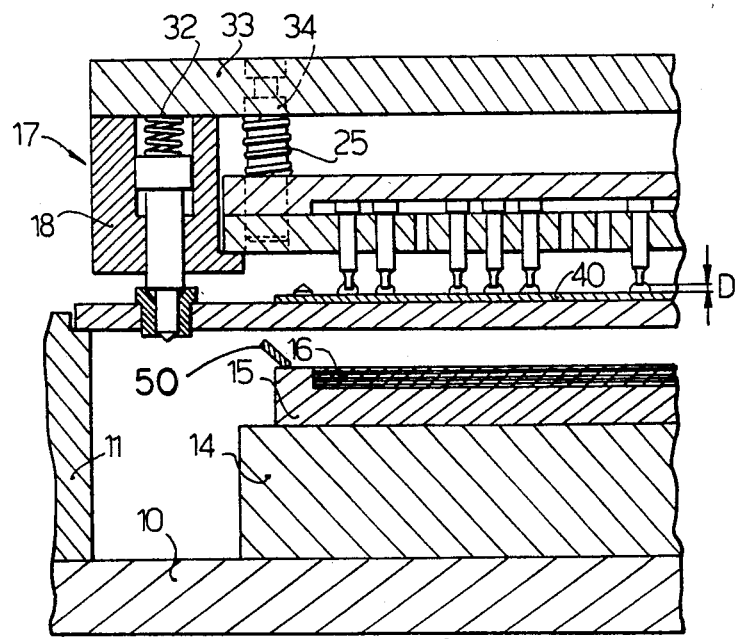
FIG.4
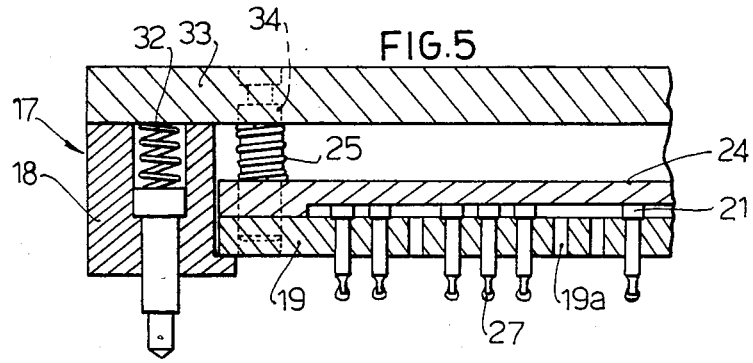
FIG.5
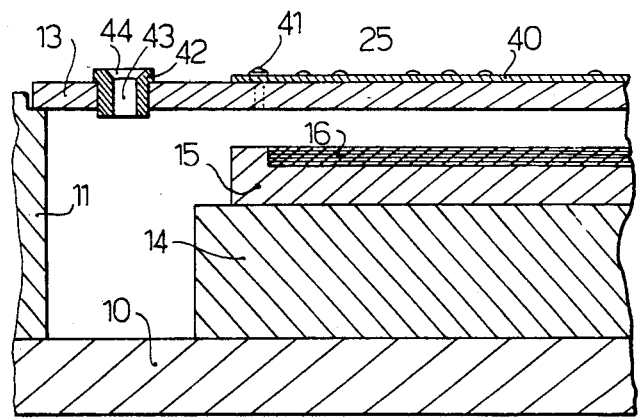

APPARATUS TO PROVIDE THE APPLICATION OF GLUE ON PRESELECTED ZONES OF PRINTED CIRCUIT BOARDS

This is a continuation of application Ser. No. 310,064 filed Oct. 9, 1981, now abandoned.

This invention relates to the technical field of application of glue on printed circuit boards in order to prepare such boards to receive the electronic components. At present, electronic components of much reduced size are developed, such as chip, MELF and SOT type of components, hereinafter referred to as microcomponents.

The application of such microcomponent on such printed circuit boards should simultaneously occur at a plurality of preselected zones with a predetermined constant amount of glue.

So far the application of glue on printed circuit boards has been carried out by a silk-screen process. This system has the disadvantage that the application surface should be perfectly smooth, so that further components cannot be previously mounted thereon.

It is the object of the present invention to provide a glue application allowing to apply a determined amount of glue in preselected zones of a printed circuit board.

According to the present invention, the above specified object has been accomplished by providing a means having push rods which are partially dipped into a tank containing the glue, then moving said push rods having a drop of glue away from the tank and depositing the drops of glue drawn by said push rods on the printed circuit boards.

A preferred solution of the invention provides that the means having push rods, hereinafter referred to as rod carrying unit, and the support of printed circuit boards are centered relative to one another every time before the glue drop contacts said printed circuit boards.

Another preferred solution of the invention provides that the level of the glue tank is maintained constant by means of a scraper.

A specific embodiment provides that the push rods comprise small cylinders of flat base, preferably having a diameter of 0.6 mm.

Another preferred solution of the invention provides that the push rods are fitted into holes in a drilled plate, said holes forming a reticule corresponding to all the possible gluing positions, said push rods being provided with a condensed head abutting against the drilled plate when a blocking plate is pressed against the ends of the push rods heads.

Preferably, the rod carrying unit is mounted on the machine, so that its position is defined by the thrust of springs, whereby in case of cambering of the printed circuit boards or other abnormal event, said rod carrying unit or a part thereof can resiliently move away from the printed circuit board to avoid any breakages.

Figure 6:
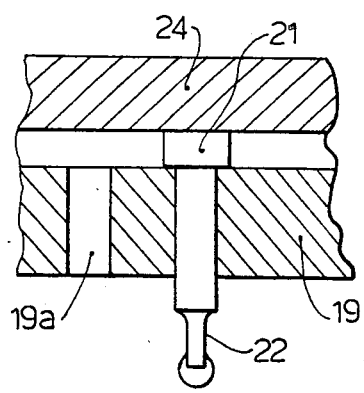
Figure 2:
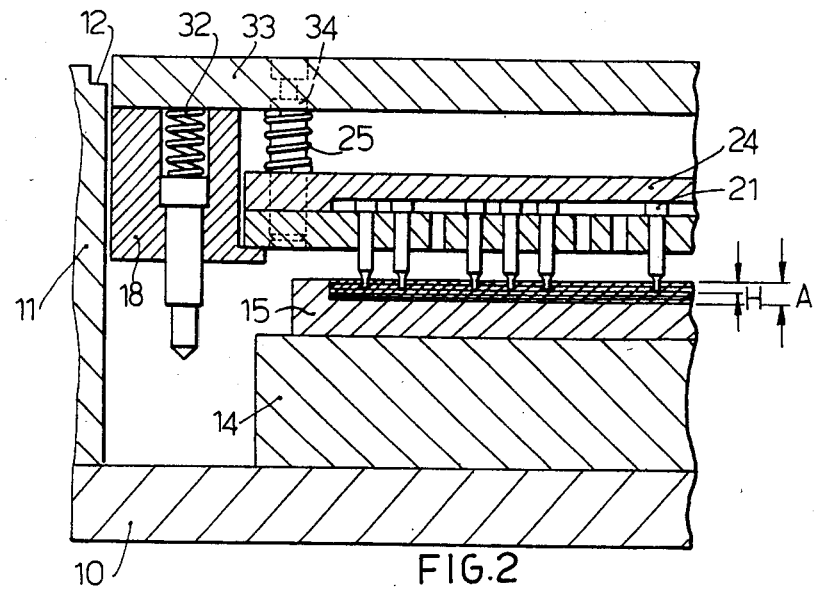

The invention will now be further explained in connection with an exemplary embodiment that has been shown in the accompanying drawings, in which:

FIGS. 1 through 5 are all schematic views in vertical section showing an apparatus according to the present invention at its different operating steps; and FIG. 6 is an enlarged view of a push rod.

Referring to the accompanying drawings, it will be seen that an apparatus according to the present invention comprises a mounting frame 10, having laterally mounted thereon a number of uprights 11 for the side guides 12 to receive the support 13 of the printed circuit board.

By means of a block 14 the fixed mounting frame 10 supports a tank 15 containing glue 16.

At the top the apparatus is provided with a rod carrying unit 17, in which the push rods 20 are fitted.

The rod carrying unit 17 is formed of a side frame 18 providing an inwardly facing abutment 18a for receiving the plate 19 having the push rods 20 inserted therein. The side frame 18 is also provided with some holes 31 with abutments 18b for receiving the centering gudgeons 30 having a head 30a bearing on abutment 18b. The centering gudgeons 30 are urged by springs 32, the other end of which bears against a closure plate 33 secured to side frame 18 by means not shown.

The plate 19 is provided with a plurality of holes 19a arranged at the intersections of the reticule corresponding to all the positions that need glue application. Said holes 19a have the push rods 20 inserted therein, push rods which comprise a head 21 and an end portion 22 terminating at the bottom with a cylindrical zone having a flat base surface 23 (FIG. 6).

The push rods 20 are held against the plate 19 by a plate 24 which is urged against said plate 19 by spring 25, of which one end bears against the plate 24, while the other end bears against the closure plate 33. The centering of the drilled plate 19 with plate 24 and closure plate 33 is obtained through pin 34 penetrating into corresponding holes provided in these parts.

The printed circuit board 40 is secured to support 13 by means of pegs 41. The support 13 provides centering bushes 42 having a hole 43 with a tapered lead-in 44, which bushes are located at the centering gudgeons 30.

In the present exemplary embodiment it was assumed that the rod carrying unit is vertically movable through two alternate strokes of different extension, while the glue tank is stationary and the printed circuit boards are horizontally moved, thus reaching the push rod operating zone. However, it is obvious that all these movements are to be considered as relative movements.

The invention will now be further explained by disclosing the operation process of this apparatus.

As it will seen from FIG. 1, at the beginning of operation, the rod carrying unit 17 is arranged directly over and at some distance from the glue tank 15.

The first step comprises the movement of unit 17 which dips down to reach the tank 15 of glue 16. Its stroke is such that the base surface 23 of push rods 20 is dipped inside said tank 15 for a predetermined height H. This height H is less than height A of the tank. As it will be seen from the drawings, the whole unit 17 has lower occupation of space in a plan view than the free space between the uprights 11 of guides 12, so that said unit 17 can insert therein and contacts glue 16.

The second operation step comprises the lifting of unit 17 and simultaneous arrival of printed circuit carrying support 13 which is moved in a horizontal plane, being displaced on said guides 12 arranged at right angles to the drawing sheet. At the end of this step, the position of the different parts is that shown in FIG. 3.

It will be seen therein that unit 17 has taken again the position of FIG. 1. All push rods 20 are now provided with a drop of glue of the same size. The board 13 for printed circuits has been brought under said unit 17.

The next operation step provides another dipping down of unit 17. The amount of this dipping down is smaller than the preceding dipping down.

This second stroke brings the base surface 23, representing the lower end of the push rods, to a distance D from the top surface of the printed circuit board 40, so that only the glue contacts only board 40 and not the push rods. The length of the centering gudgeon 30 is such that its lowermost portion, which is suitable to be received in the bushes 42, contacts hole 43 before the glue drop contacts the board 40, so as to correctly position said printed circuit board 40 relative to said push rods 20.

The next step of the process provides the return of unit 17 to its original raised position. On the printed circuit board 40 the same number of glue drops 25 as the push rods, will remain, and these drops will be of identical size on the board 40. The glue drop 27 remaining on the push rods is smaller than the glue drop 26 initially applied on the push rod 20 when the latter had been dipped in the tank 15. The next operation provides the removing of the printed circuit board 40; this removal may take place concurrently with the lifting of unit 17, so that the step corresponding to FIG. 5 can be eliminated, which step has been shown only for better representing the several glue drops on board 40 and push rods, and passing directly to FIG. 1, thus starting a new operating cycle.

Figure 3:
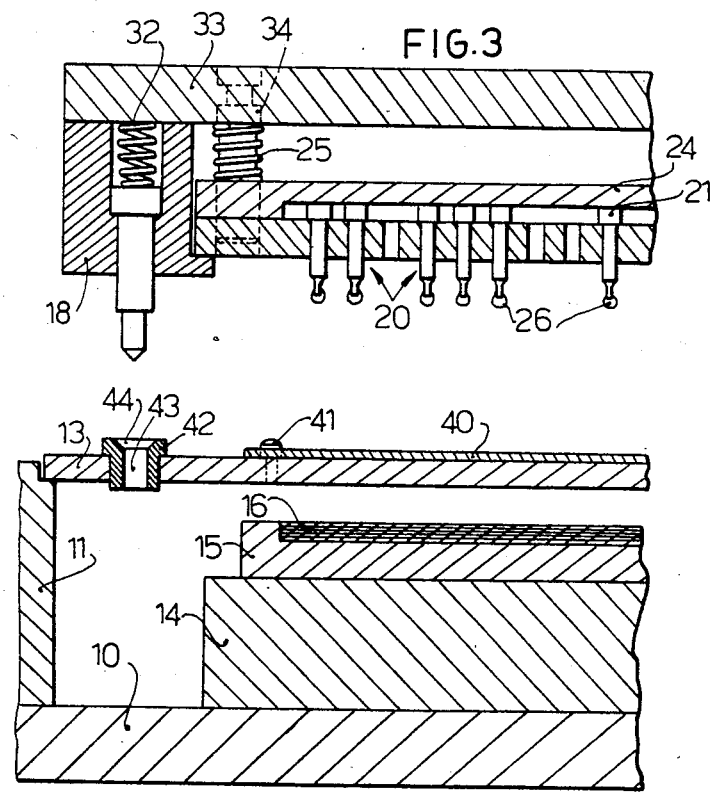

During the cycle it is also provided that during the steps corresponding to FIGS. 3 and 4, the glue tank 15 can be supplied with new glue, then leveled by means of a scraper 50, so that the glue height A is unchanged.

What we claim is:

1. An apparatus for application of glue in preselected zones of a printed circuit board, said apparatus comprising a mounting frame, a glue tank positioned on said frame, a plurality of push rods, carrier means for carrying said push rods in substantially parallel relationship and arranged at predetermined positions, support means carried by said frame for removably supporting and positioning a printed circuit board above said glue tank, said carrier means movable toward and away from said tank so that the ends of the push rods contact the glue in said tank and are provided with a glue drop that can be deposited on a printed circuit board supported on said support means to form thereon a plurality of glue drops, and means for limiting the movement of said carrier means toward said support means, said movement limiting means including centering gudgeon means carried by said carrier means and engageable in holes in said support means for laterally positioning said carrier means relative to said support means, said gudgeon means including limit means for limiting the extent of engagement of said gudgeon means with said support means so that only the glue drops contact the printed circuit board and the ends of said push rods are spaced therefrom.

2. An apparatus according to claim 1, wherein said carrier means is provided with resilient means allowing a resilient retraction of at least part thereof relative to said glue tank.

3. An apparatus according to claim 1, wherein said frame includes means to position said support means in a plane substantially parallel to said glue tank.

4. An apparatus according to claim 1, wherein said push rods have a cylindrical end at the dipping zone thereof.

5. An apparatus according to claim 1, wherein the glue tank is provided with scraper means to level the glue after refilling so that the glue height is unchanged.

* * * * *